United States Patent
Kahl et al.

[11] Patent Number: 5,882,729
[45] Date of Patent: Mar. 16, 1999

[54] PROCESS FOR PRODUCING A CASING PROVIDING A SCREEN AGAINST ELECTROMAGNETIC RADIATION

[75] Inventors: Helmut Kahl, Berlin; Bernd Tiburtius, Kleinmachnow, both of Germany

[73] Assignee: EMI-tec Elektronische Materialien, GmbH, Germany

[21] Appl. No.: 820,936

[22] Filed: Mar. 19, 1997

Related U.S. Application Data

[63] Continuation of Ser. No. 208,626, Mar. 9, 1994, abandoned.

[30] Foreign Application Priority Data

Jun. 14, 1993 [DE] Germany .......................... 43 19 965.8

[51] Int. Cl.$^6$ ...................................................... B05D 5/00
[52] U.S. Cl. .................. 427/265; 427/284; 174/35 GC; 174/35 MS
[58] Field of Search ............................ 175/35 R, 35 MS, 175/35 GC; 361/800, 816, 818; 29/592.1; 427/261, 265, 284

[56] References Cited

U.S. PATENT DOCUMENTS

| | | | |
|---|---|---|---|
| 3,627,337 | 12/1971 | Pippert | 277/233 |
| 3,885,701 | 5/1975 | Beculin | 220/325 |
| 4,157,149 | 6/1979 | Moen | 222/486 |
| 4,326,238 | 4/1982 | Takeda et al. | 361/386 |
| 4,399,317 | 8/1983 | Van Dyk, Jr. | 174/35 |
| 4,625,979 | 12/1986 | Inciong | 277/180 |
| 4,659,869 | 4/1987 | Busby | 174/35 GC |
| 4,756,784 | 7/1988 | Jones et al. | 156/157 |
| 4,964,362 | 10/1990 | Dominguez | 118/315 |
| 4,969,653 | 11/1990 | Breen | 277/134 |
| 4,977,295 | 12/1990 | Chin et al. | 174/35 GC |
| 4,980,516 | 12/1990 | Nakagawa | 174/35 GC |
| 4,993,723 | 2/1991 | Sroka et al. | 277/180 |
| 5,045,635 | 9/1991 | Kaplo et al. | 174/35 |
| 5,089,190 | 2/1992 | Trevathan et al. | 264/45.9 |
| 5,326,611 | 7/1994 | Kishita et al. | 428/78 |

FOREIGN PATENT DOCUMENTS

| | | |
|---|---|---|
| 0 182 391 | 5/1986 | European Pat. Off. . |
| 0 200 296 | 12/1986 | European Pat. Off. . |
| 0 241 192 | 10/1987 | European Pat. Off. . |
| 0 275 171 | 7/1988 | European Pat. Off. . |
| 6607180 | 1/1971 | Germany . |
| 28 27 676 A1 | 1/1979 | Germany . |
| 39 34 845 A1 | 5/1990 | Germany . |
| 39 36 534 A1 | 5/1990 | Germany . |
| 7177 | 1/1993 | Japan . |
| 1667279 A1 | 7/1991 | Russian Federation . |
| 2 054 197 | 2/1981 | United Kingdom . |
| 2 115 084 | 9/1983 | United Kingdom . |
| 2199448 | 7/1988 | United Kingdom . |
| 2 261 324 | 5/1993 | United Kingdom . |

OTHER PUBLICATIONS

Eccoshield Conductive Plastic EMI/RFI Gaskets (no date provided; it was in U.S. PTO's Possession on Nov. 1, 1970).

"Laserstrahlschweißen in der Feinmechanik," M. Hansmann, Feinwerktechnik & Messtechnik (1990).

(List continued on next page.)

*Primary Examiner*—Dean A. Reichard
*Assistant Examiner*—Hung V Ngo
*Attorney, Agent, or Firm*—Gottlieb, Rackman & Reisman, P.C.

[57] ABSTRACT

A process for producing a casing acting as a screen against electromagnetic radiation, more particularly intended for electronic operational elements, which includes a screening profile arranged in a predetermined portion of at least one part of the casing, the screening profile being made of elastic, conductive material, the elastic, conductive material being applied, by means of pressure from a needle or nozzle, directly onto the portion of the casing part, on which the screening profile is to be arranged, and a casing produced according to the process.

12 Claims, 3 Drawing Sheets

OTHER PUBLICATIONS

"Numerische Steuerungen für Werkzeugmaschinen," Prof. Dipl.–Ing. Rudolf Sautter, Vogel Buchverlag Würzburg, 1987.

N.N.: Kunststoffgehause und EMV. In: elektronik industrie, H. 3, 1992, S. 42.

Firmenschrift der Fa. Emerson & Cuming GmbH Koln: Dielektrische Werkstoffe, Ubersichtsprospekt, 1976.

Produkte fur die Mikrowellentechnik, Ubersichtsprospekt, Absorber, Abschirmstoffe, verlustarme Dielektrika, 1976.

Firmenschrift der Fa. Chomerics GmbH, Dusseldorf: Entwurf, Gestaltung einer Dictung aus leitenden Elastomeren, 1992.

CHO–Bond, leitende Kleber, 1992.

Softschield II, HF–Dichtung fur niedrige Schliesskrafte, selbstabschliessend, 1992.

CHO–Seal 3000, leitende elastonere HF–Dichtung fur Niedrige Schliessurafte, 1992.

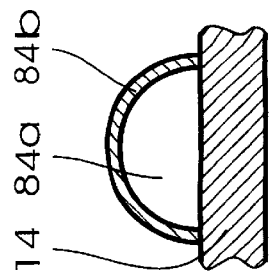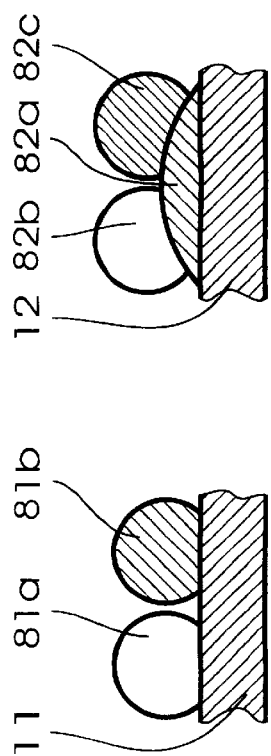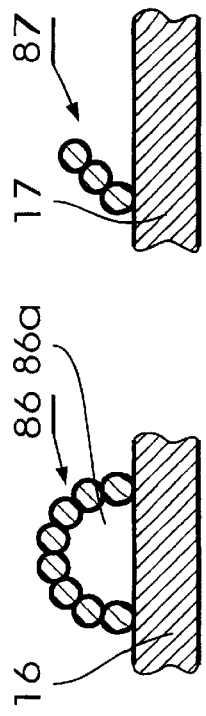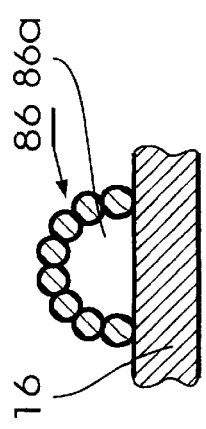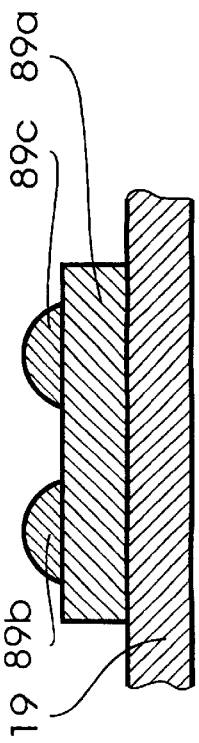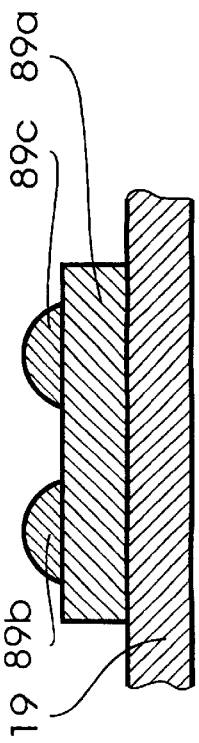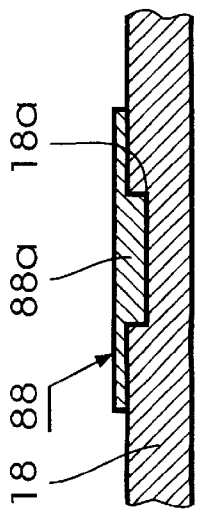

PROCESS FOR PRODUCING A CASING PROVIDING A SCREEN AGAINST ELECTROMAGNETIC RADIATION

This application is a continuation of application Ser. No. 08/208,626, filed Mar. 9, 1994, now abandoned.

BACKGROUND OF THE INVENTION

1. Field of the Invention

The invention relates to a process for producing a casing providing a screen against electromagnetic radiation, and a casing which shields its interior from electromagnetic radiation.

2. Description of the Prior Art

Electronic components and also measuring, detection and similar devices sensitive to interference by electromagnetic radiation require a screen against the electromagnetic fields present at the operational site in order to ensure a problem free operation.

They are therefore accommodated in screening cases which comprise conductive material in the walls and act as a Faraday cage.

Such casings are also used for equipment or components which, themselves, emit electromagnetic rays that must be excluded from the environment, in order for example, to prevent the emission of secret information or the malfunction of external appliances.

Today such a screening against the emission or irradiation of EMI must be more effective the more electronic apparatuses are operated and the greater the proximity at which these apparatuses must operate next to each other. Finally, the continuous increase in performance and sensitivity of such equipment also necessitates an improvement of the screening measures for which increasingly less space is available, since the relevant appliances must, moreover, be miniaturised. Thus, apart from the actual operational properties of electronic appliances, the "electromagnetic compatibility" is today a significant factor determining quality.

If, as is mostly the case in practice, the casings are multi-part constructions which must be capable of being opened occasionally (e.g. in order to renew the energy source or for maintenance purposes), it is necessary to provide the parts of the casing to be separated from each other during opening and to be reconnected again during closing, with elastic conductive seals in order to achieve an effective screening.

Whilst, on the one hand, spring-like metal seals are known for this purpose, they are, however, comparatively expensive to construct and their operability may be greatly affected by oxidation and soiling.

Furthermore, resilient sealing profiles made of elastomer which is conductive or has been made conductive, which has been mixed with carbon or metal particles in order to make it conductive, are known from e.g. U.S. Pat. No. 4,659,869 or DE-OS 28 27 676.

Such sealing profiles are normally manufactured as separate seals. They may be moulded or extruded as a continuous section and then placed into the casing to be screened.

This is a labour-intensive operation and especially in small casings it causes difficulties as seals with correspondingly small dimensions are difficult to handle. The provision of suitable guides (grooves) which facilitate the mounting on the casing requires an unreasonable amount of space and is thus a hindrance to the further miniaturisation of the appliances.

Intricately moulded seals likely to be needed for special casings require specific positioning equipment which makes the manufacture of the casing altogether more expensive. The exact positioning is, moreover, time-consuming and necessitates additional inspection.

The hot-moulding, in moulds, of such screening profiles onto the relevant casing portions or parts and the setting at a relatively high temperature and/or high pressure is also known.

This process cannot be used with parts sensitive to pressure and/or temperature such as printed circuit boards or metallised plastics casings and, as a result of the low tear resistance of the related materials, problems arise during the removal from the mould resulting in a relatively high number of rejects and, more particularly in intricately shaped casings and seals, also frequently necessitating time-consuming and labour-intensive machining on the pressed-out edges.

SUMMARY OF THE INVENTION

The invention has the object of providing a process of the above kind for producing protective screens, more particularly within the region of casing joints, which may be adapted, in a simple manner, to the most varied requirements, even in a miniaturised construction. It must also be possible to use the process according to the invention for casings to be produced in larger quantities, in a simple manner and at low cost. The casing produced according to this process must be provided with a screening profile which meets the electromagnetic and mechanical requirements and remains in good condition even after a repeated opening of the casing.

The invention is based on the concept of not producing the screening profile separately but directly and without using a mould on the casing, by means of a hardening pasty or liquid compound with the required properties which issues from an opening guided over the geometrical extent to be sealed, thereby avoiding any problems in handling, on the one hand, and the process-related disadvantages of compression moulding, on the other hand. Here, the material consists of a plastics compound which contains conductive inclusions, more particularly in the form of metal or carbon particles.

If, for forming the profile, the guidance of the needle or nozzle (i.e., dispensing conduit") over the portion of the casing part, on which the screening profile is intended to be mounted, is done by machine, more particularly controlled by computer, a high precision and great flexibility is ensured in shaping the profile so that moreover intricately moulded casings or openings of casings in small series may easily be provided with the necessary screening seal in an economic manner.

Special profiles, for example comprising undercuts, recesses etc., on the casing, are advantageously produced by guiding the needle or nozzle several times at least over predetermined regions of the portion on which the screening profile is intended to be mounted, in order to produce a multi-layer screening profile, thereby forming an exactly predetermined profile section. In so doing, a profile with a given cross-section, as desired, may advantageously be produced in several successive stages, either one nozzle coating the respective area several times, or several nozzles successively applying different strands which combine to form the desired sealing shape.

In this way cross-sectional profiles may preferably be produced which have given elasticity properties and do not acquire said elasticity because of their compressibility but because of a bending deformation, as is the case in bent lip sections or hollow sections.

It is, in particular, not necessary to provide each strand of the material with conductive inclusions since linear conductors already provide a great screening effect due to the laws of the electromagnetic field.

The inventive measures also make it possible to produce complicated seal constructions with dimensions which vary along their extent, without special difficulties. Here, according to the relevant requirements, the cross-section may vary along the edge to be sealed, within wide limits. It is also possible to produce such constructions of screening profiles which are interconnected in a way that an individual production and mounting thereof, separate from the casing, would not have been possible. Any joints in the extent of the screening seal are thus obviated by the measures according to the invention so that the sealing effect is not interrupted.

Smaller casing zones or additions which are not made of metal or metallised, which would produce a break in the closed screen, may, in an operation carried out at the same time as the other seal is produced, be coated grid-like with the profile strands according to the invention, so that homogenous screening conditions also exist in such regions.

In this way elements of a Faraday cage may even be formed from tracks of conductive plastics material and thus of the sealing compound itself, if they are mounted in the shape of a grid in a plane and conductively connected at the intersections of the grid.

Due to the fact that different elastic materials are applied when guiding the needle or nozzle several times over the predetermined regions, at least one application comprising conductive material, it is possible to produce casings with seals whose conductive, corrosive and elastic properties have been optimised to advantage.

Casings allowing easier handling may be produced especially in such a way that the elastic conductive material is applied, by computer control, directly onto the edge region of a closable aperture of the casing so that the screening seal assumes a configuration enabling an easy opening and closing of the aperture.

In order to apply the screening profiles according to the invention, computer-controlled handling appliances may be used which allow a three-dimensional guidance of the needle or nozzle, a fourth variable relating to the metering of the still liquid or pasty material, as a function of the forward movement. By means of a fifth control variable it is additionally possible to select a material, i.e. various strands of material which may also be of a different composition and may be applied alternatingly, or simultaneously in "one single operation", so that the material characteristics of the entire section, with regard to its cross-section or its extent, may be varied locally. These varying characteristics include the conductivity, elasticity (bendability or compressibility) and/or hardening or adhesive properties of the material. A firm closure through adhesion can also be achieved by means of the screening sealing elements, if adjacent material strands have corresponding characteristics, e.g. if they are the two components of a two-component adhesive.

In other advantageous embodiments of the invention, instead of parts of the casing, parts of printed circuit boards projecting beyond the outer surface of the appliance may also take over screening functions, and for adaption to adjacent screening members may be provided with the features according to the invention.

Other advantageous further developments of the invention are characterised in the sub claims and are hereinafter more fully explained in the description of preferred embodiments of the invention, with reference to the Figures.

BRIEF DESCRIPTION OF THE DRAWINGS

FIGS. 2a to 2j schematic, partial cross-sectional diagrams of screening profiles which are part of embodiments of the casing according to the invention and may be produced using embodiments of the process according to the invention, as well as FIG. 3 a schematic drawing of the length of an edge with screening profile of a casing according to the invention, in one embodiment.

DESCRIPTION OF THE PREFERRED EMBODIMENTS

Figure 1:
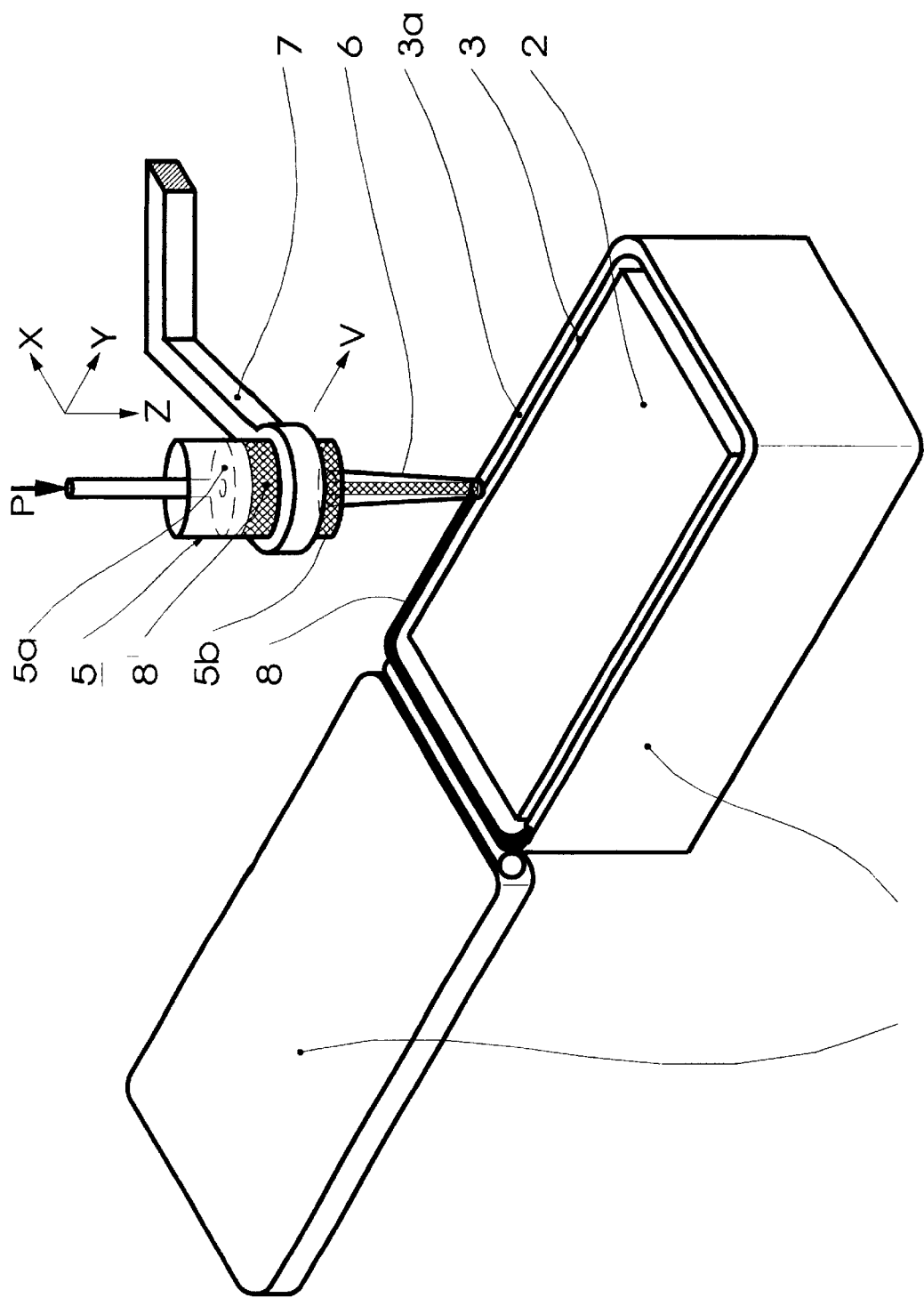
FIG. 1a basic diagram of an embodiment of the process according to the invention.

FIG. 1 shows an aluminium screening casing 1 for an electronic circuit component 2, which has a cavity 3 for inserting the circuit component, said cavity being closed with a lid 4 after the insertion of the component.

FIG. 1 also shows how a screening profile 8 is applied to the edges of the cavity 3 by an application needle 6 airtightly connected to a piston-cylinder device 5, said application needle being guided, together with the piston-cylinder device 5, by a computer-controlled robot arm 7 which exerts a pressure p onto the piston 5a of the device 5, at a small and precisely maintained spacing from the casing 1, and at the speed v, along the surrounding edge 3a. The automatic arm may be guided in the three spatial directions x, y and z.

Cylinder 5b of device 5 is filled with a quickly air- and room-temperature-drying silicone polymer 8' at ambient temperature with included metal particles, which, as a result of the pressure exerted onto the piston 5a, is pressed ("dispensed") through the channel 6a of the needle 6 onto the surface of the casing, to which it adheres and where it hardens under the influence of air, to form the elastic screening profile 8.

The cross-sectional dimensions and shape of the screening profile 8 are primarily determined by the physico-chemical-properties of the conductive plastics material used, more particularly the hardening speed, viscosity, surface tension with regard to the casing material, and the thixotropy thereof, as well as by the cross section of the channels, the pressure exerted onto the piston, the speed of the needle movement and by the environmental influences such as temperature or air humidity at the manufacturing site and may be predetermined by a suitable selection of said parameters.

In the casing 1, shown in FIG. 1, comprising a flap cover 4 mounted on one side to a hinge, it may be of advantage if the application needle 6 is guided along one edge portion of the opening 3 at a higher speed than in the other portions. A profile with a smaller cross section than that in the other edge portions would be formed here and the lid could be closed more easily.

It is possible to adjust the characteristics of the plastics material, particularly by adding fillers (carbon or the like), metal binders, surfactants and hardening catalysts or cross-linking agents.

The kind and grain size of the admixture ensuring conductivity, such as carbon, silver, silver- or gold-coated copper particles or the like, not only influence the electrical but also the mechanical and processing properties of the conductive elastic material.

FIGS. 2a to j show examples of different profile cross sections for casings which may be manufactured in several applicational steps using the process according to the invention. It is, however, apparent when using the measures according to invention, that the cross sections may also vary in the longitudinal direction of the profile, in the geometrical dimensions and material characteristics thereof.

FIGS. 2a to 2d show a combination of conductive, less elastic sealing parts (hatched) and non-conductive sealing parts which are more elastic because of the missing metal admixture, thereby achieving a combined optimal effect of sealing and screening.

FIG. 2a shows a screening and sealing construction formed by profiles 81a and 81b with a substantially circular cross section, arranged side by side in two applicational steps on the surface of a casing part 11. Such a structure is produced, when the elastic material slightly wets the surface of the casing.

FIG. 2b shows a profile structure produced in three steps, consisting of a flat-domed, broad conductive profile part 82a and a conductive part 82c "dispensed" thereon and a non-conductive part 82b on a casing portion 12, the parts 82b and 82c having a substantially circular cross section.

Such a structure is obtained if a material of the first profile part 82a wets the surface of the casing to a great extent and/or was applied with a relatively broad nozzle instead of the needle 6 shown in FIG. 1, whereas the material of parts 82b and 82c have a mild wetting tendency with respect to the surface of part 82a.

FIG. 2c shows a structure which is similar to that of FIG. 2b. Here, two approximately semi-circular, conductive screening profile parts 83b and 83c are arranged on either side of a nearly semi-circular, non-conductive, highly elastic sealing profile 83d centrally arranged on a lower, broad profile part 83a positioned on a casing surface 13.

This last profile shows great stability with respect to forces acting parallel to the casing surface, but it has a comparatively lower elasticity. It may, therefore, be particularly suitable for sliding closures.

By contrast, the profile shown in FIG. 2d, which consists of a semi-circular elastic, non-conductive profile part 84a pressed onto a casing surface 14, and a conductive coating 84b covering the surface of said profile part 84a, has extremely satisfactory elasticity properties.

A high wetting ability and satisfactory adhesion between the surfaces of the two materials are necessary for the manufacture of the profile which is very suitable for hinged covers, especially if there is a relatively great play between the closure and casing part, or if they, themselves, have a certain elasticity.

FIGS. 2e to 2i show screening profiles which consist exclusively of conductive material.

FIG. 2e shows a specially formed, single-part profile 85 positioned on a casing surface 15 which has two beads 85a and 85b connected by a flat path. Such a profile may be suitable for casings with hinged covers which have shaped edges.

FIG. 2f shows a semi-circular screening profile 86 on a casing surface 16 which consists of a plurality of circular profile strands, said screening profile, together with said casing surface, enclosing an air space 86a.

The effect of the profile, in co-operation with said "air chamber", ensures a high elasticity of the entire profile despite a comparatively unsatisfactory elasticity of its components.

FIG. 2g shows a lip-shaped screening profile 87 on a casing surface 17, which consists of a plurality of circular profile strands laid one on top of the other.

FIG. 2h shows a T-shaped profile 88, positioned on a casing surface 18 with a rectangular groove 18a, said profile engaging with a broad centre part 88a in the groove 18a and having a planar surface parallel to the casing surface 18 outside the groove 18a.

This screening profile has not only a material connection but also a positive connection with the casing surface which further increases the stability.

FIG. 2i shows a profile structure consisting of a block 89a with an approximately rectangular cross section and made of conductive, elastic material, and two flat-domed profile parts 89b and 89c arranged side by side on top of said block.

Because of its large cross section this profile structure is especially suitable as a screen with respect to strong fields, but because of the added-on sealing lips 89b and 89c it is also provided with sufficient elasticity.

It is obvious that other cross sections (almost of any kind) are possible depending on the requirements to be met.

For specific applications, a combination of prefabricated, inserted sealing profiles and of profiles produced according to the invention may also prove suitable.

Figure 2J:
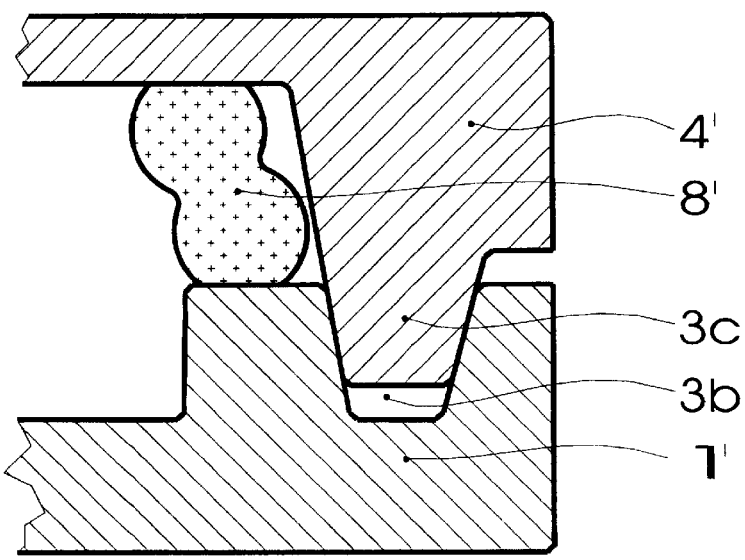

FIG. 2j shows a further embodiment of a casing provided with a sealing according to the invention in the region of an abutting edge. The casing consists of an upper part 4' which is provided with a surrounding tongue which engages in a corresponding surrounding groove 3b of the bottom part of the casing. The groove and tongue 3b and 3c taper, thus ensuring a relatively tight closure of the casing, but the mutual distance of the casing parts may vary because of manufacturing tolerances. The profile part 8' according to the invention therefore provides an additional screen within the region of the edge which, irrespective of the relative position of the two casing parts, is highly effective because of its elasticity and the incorporated conductive materials. Because of the inclination of its maximum cross sectional extent with respect to the direction in which the two casing parts close together, the elasticity is enhanced both by the compressibility and the flexural deformability of the profile part. In this way, any existing slight inhomogenieties in the sealing of the screen are reliably overcome because of the fit of the casing, and an excellent electromagnetic compatibility may, on the whole, be achieved.

Figure 3:
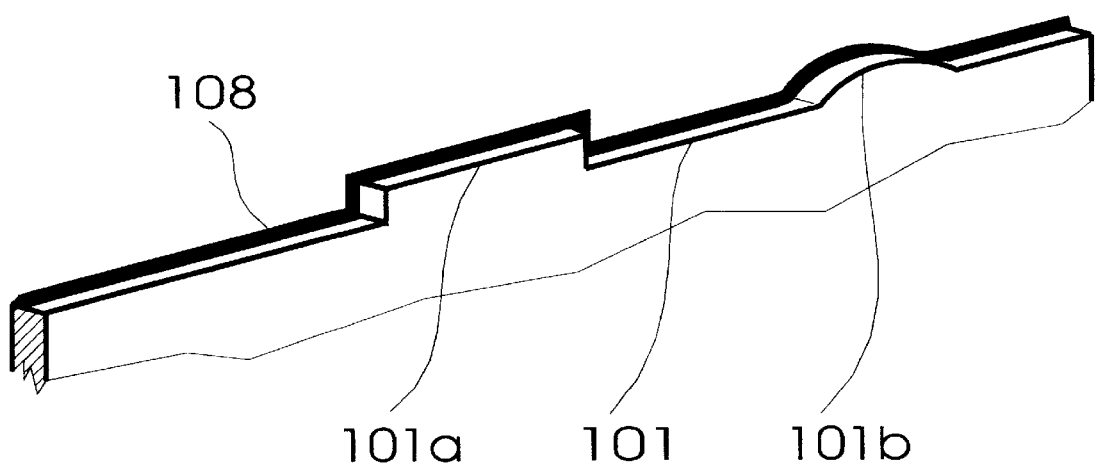

FIG. 3 shows, schematically, the length of a screening profile 108 along the edge of a casing 101, according to the invention, which has, by way of example, a rectangular edge projection 101a and a semi-circular curvature 101b. The process according to the invention enables the production of any sealing profile, as desired, so that screens of a high quality may be obtained.

The above description of casings and parts thereof also relates to components which act both as electrical and mechanical carriers and casings, for example a printed circuit board which is simultaneously used as a casing part.

Thus, the proposed solution also applies to profiles of covers in the form of a grid or basket provided in screening devices or parts thereof.

In its construction, the invention is not restricted to the above preferred embodiment. On the contrary, many variants are feasible which make use of the above solution even if they are basically of a different construction.

What is claimed is:

1. In a process for producing a casing which can be opened and closed several times providing a screen against electromagnetic radiation for objects to be encased therein, the casing including a screening profile arranged in a given opening portion of at least one casing part, said screening profile comprising materials having different elastic and conductive properties, the improvement characterized in that the materials are dispensed automatically under pressure through a conduit, directly onto the opening portion of the casing part on which the screening profile is to be arranged forming automatically a screening profile having a predetermined shape and cross section without the use of a mold so that the screening profile is not affected by opening and closing of the casing;

wherein said screening profile is multi-layered and the conduit is guided several times at least over predetermined regions of the portion on which the screening profile is to be arranged, so that a predetermined cross-section is built up from several layers which together form said screening profile and;

wherein the different elastic materials are applied when the conduit is guided over said predetermined regions, the conductive material being applied in at least one layer.

2. A process according to claim 1, characterized in that the conduit is driven by computer control, over the portion of the casing part on which the screening profile is to be arranged.

3. A process according to claim 1, characterised in that the materials is applied by computer control directly onto the edge region of a closable opening of the casing defining a screening seal, said screening seal assuming a configuration which enables an easy opening and closing of the opening.

4. A process according to claim 1, characterised in that the materials is applied at room temperature.

5. A process for producing an apparatus for providing a screen against electromagnetic radiation for objects to be encased in a casing, said casing being opened and closed said apparatus being arranged in a given opening portion of at least one casing part, the process comprising the steps of:

a) positioning a nozzle adjacent the opening portion of the casing part on which the apparatus to be formed;

b) dispensing automatically several materials having different elastic and electrically conductive properties under pressure through said nozzle directly onto said portion; and c) guiding automatically said nozzle over said portion along a predetermined path several times to define a screening profile comprising several layers and having a predetermined shape and cross section is formed without the use of a mold; said layers have different elastic and conductive properties, at least one layer being made of conductive material.

6. The process of claim 5 further comprising the step of:

d) forming layers of different materials whereby said screening profile comprises a first layer of a first material which is highly elastic and substantially non-conductive and a second layer of a second material which is highly conductive and substantially non-elastic.

7. The process of claim 5 further comprising the step of:

d) forming layers of different materials whereby between adjacent layers containing conductive inclusions, there is at least one layer which does not contain such inclusions.

8. The process of claim 5 further comprising the step of:

d) forming layers of different materials whereby adjacent layers are composed of materials having different characteristics.

9. The process of claim 5 further comprising the step of:

d) forming layers of different materials whereby layers adjoining one another in a longitudinal direction are composed of materials having different characteristics.

10. The process of claim 8 wherein the characteristics of the materials is selected from the group consisting of compressibility, elasticity, bendability, adhesiveness and hardness.

11. The process of claim 9 wherein the characteristics of the materials is selected from the group consisting of compressibility, elasticity, bendability, adhesiveness and hardness.

12. The process of claim 5 further comprising the step of hardening said screening profile by air.

* * * * *